United States Patent
Park et al.

(10) Patent No.: US 8,212,244 B2
(45) Date of Patent: Jul. 3, 2012

(54) BLUE ORGANIC LIGHT EMITTING DEVICE

(75) Inventors: Mie-Hwa Park, Yongin (KR);
Kyung-Hoon Choi, Yongin (KR);
Young-Suck Choi, Yongin (KR);
Young-Ho Park, Yongin (KR)

(73) Assignee: Samsung Mobile Display Co., Ltd.,
Giheung-Gu, Yongin, Gyunggi-Do (KR)

( * ) Notice: Subject to any disclaimer, the term of this patent is extended or adjusted under 35 U.S.C. 154(b) by 227 days.

(21) Appl. No.: 12/692,401

(22) Filed: Jan. 22, 2010

(65) Prior Publication Data

US 2010/0187521 A1    Jul. 29, 2010

(30) Foreign Application Priority Data

Jan. 23, 2009  (KR) ............... 10-2009-0006013

(51) Int. Cl.
*H01L 51/52* (2006.01)
(52) U.S. Cl. .... 257/40; 257/101; 257/103; 257/E51.018
(58) Field of Classification Search ............ 257/40, 257/101, 103, E51.018
See application file for complete search history.

(56) References Cited

U.S. PATENT DOCUMENTS

2011/0027616 A1* 2/2011 Kashiwabara et al. ....... 428/690

FOREIGN PATENT DOCUMENTS

KR     10-0575987 B    4/2006
KR  10-2007-0117200 A  12/2007

OTHER PUBLICATIONS

Korean Office Action issued by Korean Patent Office on Mar. 29, 2010, corresponding Korean Patent Application No. 10-2009-0006013 and Request for Entry of the Accompanying Office Action attached herewith.

* cited by examiner

*Primary Examiner* — Long Pham
(74) *Attorney, Agent, or Firm* — Robert E. Bushnell, Esq.

(57) ABSTRACT

A blue organic light emitting device is provided. The blue organic light emitting device comprises a first electrode; a second electrode; and an organic layer including an electron transport layer between the first electrode and the second electrode, wherein the electron transport layer includes a material having an energy gap of 2.8 eV or more between a highest occupied molecular orbital (HOMO) and a lowest unoccupied molecular orbital (LUMO).

6 Claims, 2 Drawing Sheets

Blue Light Emission

BLUE ORGANIC LIGHT EMITTING DEVICE

CLAIM OF PRIORITY

This application makes reference to, incorporates the same herein, and claims all benefits accruing under 35 U.S.C. §119 from an application for BLUE ORGANIC LIGHT EMITTING DEVICE earlier filed in the Korean Intellectual Property Office on 23 Jan. 2009 and there duly assigned Serial No. 10-2009-0006013.

BACKGROUND OF THE INVENTION

1. Field of the Invention

The present invention relates to a blue organic light emitting device having enhanced current efficiency, including: a substrate; a first electrode formed on the substrate; a hole transport layer formed on the first electrode; a blue light emitting layer formed on the hole transport layer; an electron transport layer formed on the blue light emitting layer; and a second electrode formed on the electron transport layer, wherein the electron transport layer includes a material having an energy gap of 2.8 eV or more between the highest occupied molecular orbital (HOMO) and the lowest unoccupied molecular orbital (LUMO).

2. Description of the Related Art

Light emitting diodes are self-emission type devices. Light emitting diodes have wide viewing angles, high contrast ratios, and short response speeds.

Light emitting diodes can be categorized into inorganic light emitting diodes and organic light emitting diodes (OLEDs) according to the material that is used to form the light emitting layer. OLEDs have higher brightness, lower operating voltages, and shorter response speeds than inorganic light emitting diodes, and can realize many colors.

A conventional OLED includes an anode formed on a substrate, and a hole transport layer, a light emitting layer, an electron transport layer and a cathode are sequentially formed, in this order, on the anode. The hole transport layer, the light emitting layer and the electron transport layer are organic thin films formed of an organic material.

An OLED having the structure as described above has the following driving principle.

When a voltage is applied between the anode and the cathode, holes injected from the anode move toward the light emitting layer through the hole transport layer and electrons injected from the cathode move toward the light emitting layer through the electron transport layer. The holes and electrons, which are also called carriers, are recombined in the light emitting layer and form excitons. The excitons are changed from an excitation state into the ground state, and thus, fluorescent molecules of the light emitting layer emit light.

Green light emitting materials have very high luminescent efficiencies compared to red or blue light emitting materials. Accordingly, development of conventional devices has been focused on green light emission. Thus, conventionally, the energy level of the electron transport layer forming material is adjusted to optimize light emission for a green light emitting layer. In other words, the energy level of the electron transport layer forming material is optimized for green light emitting devices. Accordingly, when an organic layer forming material that is optimized for the energy level of a green light emitting layer is used in blue light emitting devices, the efficiency of the blue light emitting devices will be low compared to the efficiency of green light emitting devices.

To improve the luminescent efficiency of blue light emitting devices, there is a need to adjust the energy level of the electron transport layer forming material to be suitable for a blue light emitting layer.

Most conventional techniques for improving the luminescent efficiency of blue light emitting devices relate to the synthesis of novel compounds, and solutions for improving the luminescent efficiency of blue light emitting devices have not yet been found.

SUMMARY OF THE INVENTION

The present invention provides a blue organic light emitting device having high brightness and high efficiency.

According to an aspect of the present invention, there is provided a blue organic light emitting device including: a substrate; a first electrode formed on the substrate; a hole transport layer formed on the first electrode; a blue light emitting layer formed on the hole transport layer; an electron transport layer formed on the blue light emitting layer; and a second electrode formed on the electron transport layer, wherein the electron transport layer includes a material having an energy gap of 2.8 eV or more between the highest occupied molecular orbital (HOMO) and the lowest unoccupied molecular orbital (LUMO). According to an embodiment of the present invention, the material having an energy gap of 2.8 eV or more between the HOMO and LUMO may be selected from the group consisting of anthracene, a compound containing an anthracene unit, naphthalene, a compound containing a naphthalene unit, styrene, a compound containing a styrene unit, a silicon-containing compound, triphenylene, a compound containing a triphenylene unit, pyrene, and a compound containing a pyrene unit, and combinations thereof.

According to an embodiment of the present invention, the electron transport layer may be a mixed electron transport layer including an electron transporting material and an electron injection material.

According to an embodiment of the present invention, the electron injection material is selected from the group consisting of LiQ, LiF, NaCl, CsF, $Li_2O$ BaO, and combinations thereof.

According to an embodiment of the present invention, the blue organic light emitting device may further include a p-dopant material having a LUMO energy level lower than 5 eV and a HOMO energy level lower than 7 eV, wherein the p-dopant material is disposed between the first electrode and the blue light emitting layer.

According to an embodiment of the present invention, the blue organic light emitting device may further include an intermediate layer between the first electrode and the blue light emitting layer, the intermediate layer including a p-dopant material having a LUMO energy level lower than 5 eV and a HOMO energy level lower than 7 eV, wherein the intermediate layer is disposed between the first electrode and the blue light emitting layer.

According to an embodiment of the present invention, the blue organic light emitting device may further include an intermediate layer which may be a hole transport layer.

BRIEF DESCRIPTION OF THE DRAWINGS

The above and other features and advantages of the present invention will become more apparent by the detailed description of exemplary embodiments thereof with reference to.

DETAILED DESCRIPTION OF THE INVENTION

Hereinafter, the present invention will be described in detail by way of an explanation of an exemplary embodiment of the invention.

Figure 1:
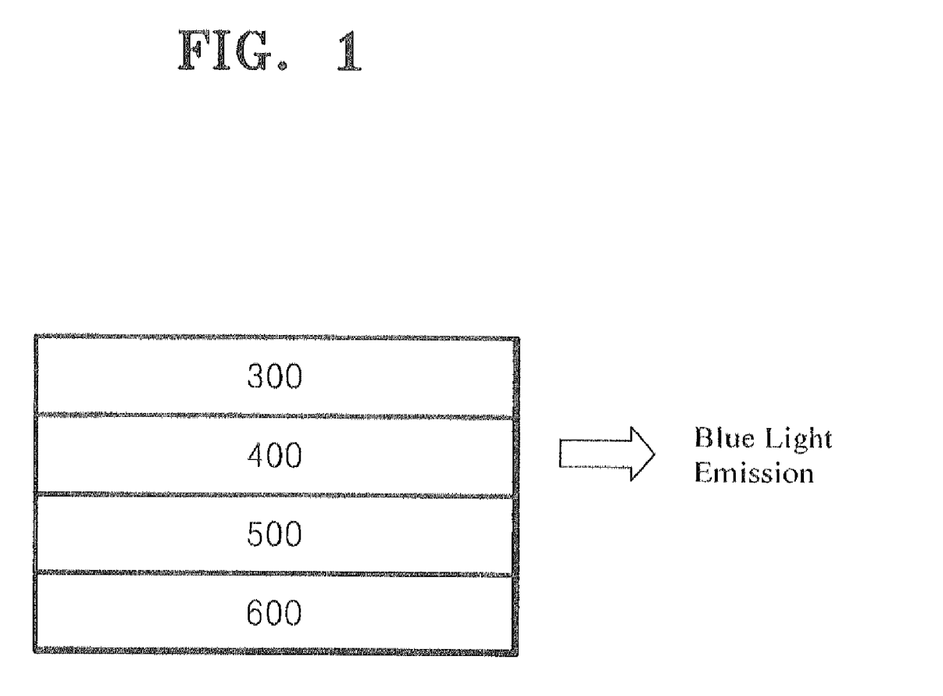
FIG. 1 which is a sectional view of a blue organic light emitting diode according to an embodiment of the present invention.
Figure 2:
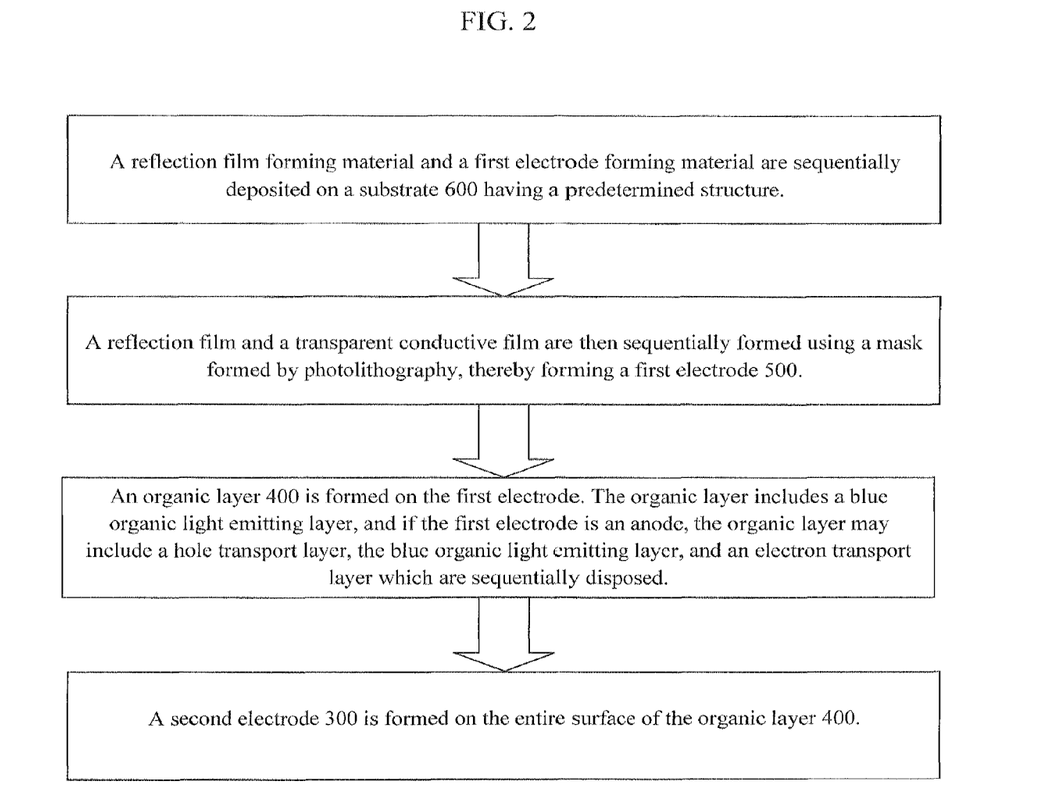
FIG. 2 which is a flowchart showing the steps for fabricating an embodiment of the organic light emitting diode of the present invention.

A blue organic light emitting device according to an embodiment of the present invention is shown in FIG. 1 and may include: a substrate 600; a first electrode 500 formed on the substrate; a hole transport layer (included in 400) formed on the first electrode; a blue light emitting layer (included in 400) formed on the hole transport layer; an electron transport layer (included in 400) formed on the blue light emitting layer; and a second electrode 300 formed on the electron transport layer, wherein the electron transport layer may include a material having an energy gap of 2.8 eV or more between the highest occupied molecular orbital (HOMO) and the lowest unoccupied molecular orbital (LUMO).

According to an embodiment of the present invention, the electron transport layer may include any known material that has an energy gap of 2.8 eV or more between the HOMO and LUMO. The material may be anthracene, a compound containing an anthracene unit, naphthalene, a compound containing a naphthalene unit, styrene, a compound containing a styrene unit, a silicon-containing compound, triphenylene, a compound containing a triphenylene unit, pyrene, a compound containing a pyrene unit, and combinations thereof. Non-limiting examples of the material includes compounds represented by Formulae 1 through 14 below and combinations thereof:

Formula 1 where $B^1$ and $B^2$ are each independently, a hydrogen atom, a C6-C24 aryl group, a C1-C24 alkyl group or a C3-C24 cycloalkyl group; $A^1$ through $A^5$ are each independently, hydrogen, a C1-C24 alkyl group, or a C3-C24 cycloalkyl group; $R^1$ through $R^4$ are each independently, hydrogen, a C1-C24 alkyl group, or a C1-C24 alkoxy group; and $X^1$ through $X^5$ are each independently, hydrogen, methyl, tert-butyl, phenyl, bi-2-biphenylyl, 3-biphenylyl, m-terphenyl-5'-yl, m-terphenyl-3-yl, 1-naphthyl, 2-naphthyl, 2-(2-naphthyl)phenyl, 3,5-di(1-naphthyl)phenyl, 3,5-di(2-naphthyl)phenyl, p-terphenyl-2'-yl, m-terphenyl-2-yl, o-terphenyl-2-yl, p-terphenyl-2-yl, 5-'phenyl-m-terphenyl-2-yl, 5'-phenyl-m-terphenyl-3-yl, m-quaterphenyl-2-yl, m-quaterphenyl-3-yl, 6-(m-terphenyl-5'-yl)-2-naphthyl, or 4-(m-terphenyl-5'-yl)-1-naphthyl;

Formula 2 where A, B, C, D are each independently, a substituted or unsubstituted C1-C20 alkyl group, a substituted or unsubstituted C6-C40 aryl group; and $R^1$ through $R^{10}$ are each independently, a hydrogen atom, a substituted or unsubstituted C10-C30 alkyl group, a substituted or unsubstituted C1-C30 alkoxy group, a substituted or unsubstituted C6-C20 aryl group, a substituted or unsubstituted C6-C18 aryloxy group, a substituted or unsubstituted C6-C30 condensed multiple-ring group, a C5-C30 substituted or unsubstituted heterocyclic group, amino, a C2-C30 alkylamino group, a C6-C30 arylamino group, a cyano, nitro, hydroxyl or halogen atom, wherein adjacent groups together may form a saturated or unsaturated carbon ring;

Formula 3 where n may be an integer in the range of 1 to 4; m may be an integer in the range of 1 to 2; l may be an integer in the range of 0 to 1; $Ar_1$ is selected from the group consisting of phenyl, naphthalene, anthracene, thiophene, oxadiazole, carbazole, fluorene, diphenyl, vinylphenyl, and a derivative of any of the above; $Ar_2$ is selected from the group consisting of phenyl, naphthalene, anthracene, thiophene, oxadiazole, carbazole, fluorene, diphenyl, vinylphenyl, 2,4,6-triphenyl-1,3,5-triazine, and a derivative of any of the above; $Ar_3$ and $Ar_4$ are each independently, phenyl, naphthalene or a derivative of either; and each of R1 and R2 is independently hydrogen, fluorine (F), trifluoro methyl ($CF_3$), cyanide (CN), methoxy (OMe), methyl ($CH_3$) or vinylphenyl;

Formula 4 where $Ar_1$ is phenylene or naphthylene; $Ar_2$ and $Ar_3$ are each independently, aryl; A is a chemical bond or arylene; $R_1$ and $R_2$ are each independently, hydrogen, a C1-C20 alkyl group, or a C1-C20 aryl group, or $R_1$ and $R_2$ may be connected to a C4-C6 alkylene group or an aryl-fused C4-C6 alkylene group and together form a Spiro ring; and $R_3$ through $R_8$ are each independently, hydrogen, a C1-C20 alkyl group, a C1-C20 alkoxy group, a C1-C20 aryl group, halogen, a C1-C20 alkylsilyl group or dicyanoethylene, wherein $Ar_1$ through $Ar_3$, A, and $R_1$ through $R_8$ may be further substituted with one or more substituents selected from the group consisting of a C1-C20 alkyl group, C1-C20 aryl, and halogen;

Formula 5 where A and B are each independently, a chemical bond or a $C_6$-$C_{30}$ arylene group; and $Ar_1$ and $Ar_2$ are each independently, a hydrogen atom, a $C_1$-$C_{20}$ linear or branched alkyl or alkoxy group, a $C_6$-$C_{30}$ aryl or heteroaryl group, phenyl, naphthyl, anthryl or fluorenyl, wherein the phenyl, naphthyl, anthryl and fluorenyl may be unsubstituted or substituted with one or more halogen, and $Ar_1$ and $Ar_2$ are not hydrogen at the same time and $R_1$ through $R_7$ are each independently, a hydrogen atom, a $C_1$-$C_{20}$ linear or branched alkyl group or a $C_6$-$C_{30}$ aryl group;

Formula 6 where $R^1$ through $R^{19}$ are each independently, hydrogen, alkyl, cyclo alkyl, a heterocyclic group, alkenyl, cyclo alkenyl, alkynyl, alkoxy, alkylthio, arylether, arylthioether, aryl, hetero aryl, halogen, cyano, carbonyl, carboxyl, oxy carbonyl, carbamoyl, silyl, or phosphin oxide, wherein at least one of $R^{11}$ through $R^{18}$ is alkyl or cycloalkyl, a heterocyclic group, alkoxy, arylether, aryl, or hetero aryl, A is a single bond, hetero allylene, or allylene, and at least one of $R^{11}$ through $R^{19}$ and at least one of $R^1$ through $R^{10}$ are connected to A;

Formula 7

(2)

where $R^1$ through $R^{10}$ are each independently, hydrogen, alkyl, cyclo alkyl, aralkyl, alkenyl, cyclo alkenyl, alkynyl, alkoxy, alkylthio, arylether, arylthioether, aryl, hetero aryl, halogen, cyano, aldehyde, carbonyl, ester, carbamoyl, or silyl, wherein at least one of $R^1$ through $R^{10}$ is substituted with at least one selected from the group consisting of cyano, hetero aryl containing nitrogen capable of receiving electrons, and ethynyl having a structure (2) where Ar1 is aryl or hetero aryl and a is a connection site with respect to an anthracene structure, and $R^9$ and $R^{10}$ are not substituted with ethynyl having the structure (2) at the same time;

Formula 8

(2)

(3)

(4)

where at least one of $R^1$ through $R^{10}$ is a substituent having a structure selected from structures (2) through (4) and the remaining substituents are each independently, a hydrogen atom, alkyl, cyclo alkyl, heterocyclic group, alkenyl, cyclo alkenyl, alkynyl, alkoxy, alkylthio, arylether, arylthioether, aryl, hetero aryl, halogen, cyano, carbonyl, ester, carbamoyl, silyl, or phosphine oxide; and $Ar^1$ through $Ar^5$ are each independently, aryl or hetero aryl;

Formula 9 where $Ar^1$ and $Ar^2$ are each independently, a substituted or unsubstituted C6-C50 aryl group, wherein $Ar^1$ and $Ar^2$ have different structures; and $R^1$ through $R^8$ are each independently, a hydrogen atom, a substituted or unsubstituted C6-C50 aryl group, a substituted or unsubstituted C5-C50 aromatic heterocyclic group, a substituted or unsubstituted C1-C50 alkyl group, a substituted or unsubstituted C1-C50 alkoxy group, a substituted or unsubstituted C6-C50 aralkyl group, a substituted or unsubstituted C5-C50 aryloxy group, a substituted or unsubstituted C5-C50 arylthio group, a substituted or unsubstituted C1-C50 alkoxycarbonyl group, carboxyl, a halogen atom, cyano, nitro, or hydroxyl:

Formula 10 where X is a hydrogen atom, a substituted or unsubstituted C6-C50 aromatic group, a substituted or unsubstituted C5-C50 aromatic hetero-ring group, a substituted or unsubstituted C1-C50 alkyl group, a substituted or unsubstituted C1-C50 cycloalkyl group, a substituted or unsubstituted C1-C50 alkoxy group, a substituted or unsubstituted C6-C50 aralkyl group, a substituted or unsubstituted C5-C50 aryloxy group, a substituted or unsubstituted C5-C50 arylthio group, a substituted or unsubstituted C1-C50 alkoxycarbonyl group, a substituted or unsubstituted silyl group, carboxyl, halogen atom, cyano, nitro, or hydroxyl; $Ar^1$ and $Ar^2$ are each independently, a substituted or unsubstituted C10-C50 condensed aromatic group, wherein at least one of $Ar^1$ and $Ar^2$ is 1-naphthyl having a structure (2) below, 2-naphthyl having a structure (3) below, or triptycenyl having a structure (4) below where each of $R^1$ through $R^7$ is a hydrogen atom or a substituted or unsubstituted C1-C50 alkyl group, and at least one adjacent pair of $R^1$ through $R^7$ are alkyl and together form a cyclic structure, X is as described above, each of d through i may be an integer in the range of 0 to 4; each of a through c may be an integer in the range of 0 to 4; and n may be an integer in the range of 1 to 3, wherein when n is 2 or 3, the units inside the parentheses [ ] may be the same as or different from each other;

structure (2)

structure (3)

structure (4)

Formula 11 where $R^1$ through $R^{10}$ are each independently, hydrogen, alkyl, cycloalkyl, a heterocyclic group, alkenyl, cycloalkenyl, alkynyl, alkoxy, alkylthio, arylether, arylthioether, aryl, hetero aryl, halogen, carbonyl, carboxyl, oxy carbonyl, carbamoyl, phosphine oxide, or silyl, wherein adjacent substituents of $R^1$ through $R^{10}$ together may form a ring and at least one of $R^1$ through $R^{10}$ is linked to cyano; n may be an integer in the range of 1 to 4;

Formula 12 where $R^1$ through $R^{10}$ are each independently, hydrogen, alkyl, cyclo alkyl, a heterocyclic group, alkenyl, cyclo alkenyl, alkynyl, alkoxy, alkylthio, arylether, arylthioether, aryl, hetero aryl, halogen, cyano, carbonyl, carboxyl, oxy carbonyl, carbamoyl, silyl, phosphine oxide, or a condensation ring formed between adjacent substituents; n may be an integer in the range of 1 to 3, wherein the n represents the number of functional groups selected from $R^1$ through $R^{10}$ that are binding sites with respect to A; and A is a unit including hetero aryl, wherein if n is 2 or 3, the A's may be the same or different from each other;

Formula 13 where R is a hydrogen atom, a substituted or unsubstituted C1-C50 alkyl group, a substituted or unsubstituted C5-C50 aryl group, a substituted or unsubstituted C1-C50 aralkyl group, a substituted or unsubstituted C3-C50 cycloalkyl group, a substituted or unsubstituted C1-C50 alkoxy group, a substituted or unsubstituted C5-C50 aryloxy group, a substituted or unsubstituted C5-C50 arylamino group, a substituted or unsubstituted C1-C20 alkylamino group, cyano or a halogen atom; k may be an integer in the range of 1 through 9, wherein if k is 2 or more, a plurality of R's may be the same as or different from each other; $A_1$ and $A_2$ are each independently, a hydrogen atom, a substituted or unsubstituted C1-C50 alkyl group, a substituted or unsubstituted $C_5$-C50 aryl group, a substituted or unsubstituted C1-C50 aralkyl group, a substituted or unsubstituted C3-C50 cycloalkyl group, a substituted or unsubstituted C1-C50 alkoxy group, a substituted or unsubstituted C5-C50 aryloxy group, a substituted or unsubstituted C5-C50 arylamino group, a substituted or unsubstituted C1-C20 alkylamino group, cyano or a halogen atom; each of m and n is in a range of 0 through 5, wherein if m is 2 or more, a plurality of $A_1$'s may be the same as or different from each other or together form a saturated or unsaturated ring, and if n is 2 or more, a plurality of $A_2$'s may be the same as or different from each other or together form a saturated or unsaturated ring, wherein at least one of $A_1$ and $A_2$ is any one group selected from the group consisting of a substituted or unsubstituted alkyl group having at least two carbons, a substituted or unsubstituted aralkyl group having at least two carbons, a substituted or unsubstituted cycloalkyl group having at least three carbons, a substituted or unsubstituted alkoxy group having at least two carbons, and a substituted or unsubstituted alkylamino group having at least two carbons; and p may be an integer in the range of 1 through 9, wherein if p is 2 or more, a plurality of units inside the parentheses $(\ )_p$ may be the same as or different from each other, and k plus p may be an integer that is 10 or lower; and

Formula 14 where $R_1$ through $R_{15}$ may independently be a C1-C50 substituent group, a hydrogen atom, phenyl, naphthyl, alkyl, cyclo alkyl, carbazole, dibenzo furane, tertiarybutyl, or a heterocyclic group, wherein adjacent substituents may form a condensed ring, at least one of $R_1$ through $R_{10}$ may form a single bond with A, wherein A may be linked to at least two substituents selected from $R_1$ through $R_{10}$ and the binding site and symmetry of A are not limited; $Y^1$ through $Y^5$ may be selected from a nitrogen atom and a carbon atom; and $R_{11}$ through $R_{15}$ may be further selected from phenyl, carbazole, dibenzofurane, and tertiarybutyl, wherein if at least one of $Y^1$ through $Y^5$ is a nitrogen atom, $R_{11}$ through $R_{15}$ are not present at the nitrogen atom.

Non-limiting examples of the compounds represented by Formulae I through 14 include compounds a1 through a23 below or a mixture thereof:

-continued a7 a8 a9 a10 a11 a12

-continued a13 a14 a15 a16 a17 a18 a19 a20 a21 a22 a23

The energy level of conventional electron transport layer forming materials is adjusted to be suitable for a green light emitting layer and is thus optimized for a green light emitting device. Accordingly, the luminescent efficiency of a blue light emitting device including conventional electron transport layer forming materials is low. To improve the luminescent efficiency of a blue light emitting device, the energy level of an electron transport layer forming material can be adjusted to be suitable for a blue light emitting layer. In addition, if such materials as described above, that is, a material having an energy level similar to that of the LUMO of the blue light emitting layer is used to form an electron transport layer, more electrons are injected into the blue light emitting layer from a cathode and the luminescent efficiency of the blue light emitting device may be improved.

An electron transport layer of a blue organic light emitting device according to an embodiment of the present invention may be a mixed electron transport layer (Mixed ETL) including an electron injection material. The electron injection material may be any known electron injection material, such as LiCl, LiF, NaCl, CsF, $Li_2O$ or BaO, or combinations thereof. When a material having an energy gap of 2.8 eV or more between the HOMO and LUMO is used together with the electron injection material to form the electron transport layer, more electrons are injected and thus the luminescent efficiency of the blue organic light emitting device is further increased.

In addition, the blue organic light emitting device may include a p-dopant material between a first electrode and a blue light emitting layer, wherein the p-dopant material has a LUMO energy level of 5 eV or lower and a HOMO energy level of 7 eV or lower. Also, the p-dopant material can be included in any intermediate layer between the first electrode and the blue light emitting layer. In this case, the energy level of the LUMO of the p-dopant material may be similar to the energy level of the HOMO of a hole transport layer and thus the luminescent efficiency of the blue light emitting device is increased. For example, the intermediate layer may be a hole transport layer.

According to an embodiment of the present invention, the p-dopant material may be a compound represented by any one of Formulae 15 through 18 below or a mixture thereof:

Formula 15 where $X_1$ through $X_6$ are each independently, hydrogen, a halogen atom, hydroxyl, cyano, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group;

Formula 16 where $R_1$ through $R_{16}$ are each independently, hydrogen, a halogen atom, hydroxyl, cyano, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group, and M is $Cu^{2+}$, $Mn^{2+}$, $Fe^{2+}$ or $Zn^{2+}$;

Formula 17 where $X_1$ through $X_8$ are each independently, hydrogen, a halogen atom, hydroxyl, cyano, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group;

Formula 18 where $X_1$ through $X_{10}$ are each independently, hydrogen, a halogen atom, hydroxyl, cyano, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group.

Non-limiting examples of the compounds represented by Formulae 15 through 18 and a mixture thereof include compounds having structures a24 through a28 below or a mixture thereof:

a24 a25 a26 a27 a28

Unless otherwise indicated in the definition for a Formula or in a claim, the term "substituted" refers to a hydrogen atom, alkyl, cyclo alkyl, heterocyclic group, alkenyl, cyclo alkenyl, alkynyl, alkoxy, alkylthio, arylether, arylthioether, aryl, hetero aryl, halogen, cyano, carbonyl, ester, carbamoyl, silyl, or phosphine oxide.

FIG. 1 is a sectional view of a front emission type organic light emitting diode according to an embodiment of the present invention. Referring to FIG. 1, a reflection film forming material and a first electrode forming material are sequentially deposited on a substrate 600 having a predetermined structure.

The reflection film forming material may be, for example, Ag having high reflectivity or a Ag alloy including Ag and at least one selected from the group consisting of Sm, Tb, Au and Cu. The reflection film forming material may be deposited to a thickness in the range of 500 to 2000 Å. The first electrode forming material may be, for example, indium tin oxide (ITO), IZO or $In_2O_3$. The first electrode forming material may be deposited to a thickness in the range of 30 through 100 Å.

Then, a reflection film (not shown) and a transparent conductive film (not shown) are sequentially formed using a mask formed by photolithography, thereby forming a first electrode 500.

Then, an organic layer 400 is formed on the first electrode 500.

The organic layer 400 includes a blue organic light emitting layer, and if the first electrode 500 is an anode, the organic layer 400 may include a hole transport layer, the blue organic light emitting layer, and an electron transport layer which are sequentially disposed. In other embodiments, if necessary, the organic layer 400 may further include a hole injection layer, an electron injection layer, or the like.

The blue organic light emitting layer may include a low molecular weight material or a polymer material. In the blue organic light emitting layer, a fluorescent host may be an ADN derivative, a fluorescent dopant may be DPAVD or TBPE, a phosphorescent host may be CBP or mCP, and a phosphorescent dopant may be Firpic. If the blue organic light emitting layer is fluorescent, the fluorescent host may be the ADN derivative. The polymer material may be polyflourene or a derivative thereof.

The hole injection layer may be formed using any one selected from the group consisting of copper phthalocyanine (CuPc), PEDOT, m-MTDATA, and triphenylamine. The hole transport layer may be formed using any one hole transporting material selected from aromatic tertiary amines. Aromatic tertiary amines refer to compounds that include at least one trivalent nitrogen atom that is linked to only carbon atoms (at least one carbon atom is a constituent element of an aromatic ring). Examples of the aromatic tertiary amines include arylamine, such as monoarylamine, diarylamine, triarylamine or polymerizable arylamine.

A material for forming the electron transport layer may be a material having an energy gap of 2.8 eV between the HOMO and LUMO as described above. In other cases, the material can be used together with a conventional electron transport layer forming material such as a metal-chelated oxynoide compound including chelate of oxyn (conventionally referred to as '8-quinolinole' or '8-hydroxyquinoline'), Alq3, butadiene derivatives, a heterocyclic optical brightener, benzanole or triazine.

The material can also be used together with an electron injection layer forming material such as LiQ or LiF. If the material and the electron injection layer forming material are mixed to form an electron transport layer, electron injection characteristics are improved and thus, blue luminescent efficiency is improved.

Then, a second electrode 300 is formed on the entire surface of the organic layer 400.

The second electrode 300 may be formed of a transparent material such as ITO or IZO. Alternatively, the second electrode 300 may be formed to a small thickness so that the second electrode 300 becomes light transmissible. In this case, the second electrode 300 may be formed of a metal having a low work function, such as Mg, Ag, Al, Ca, or an alloy thereof. For example, the second electrode 300 may be formed of MgAg.

The present invention will now be described in further detail with reference to the following examples. These examples are for illustrative purposes only and are not intended to limit the scope of the present invention.

EXAMPLES

Example 1

NPB constituting a known hole injection layer forming material is vacuum deposited on a Corning 15 $\Omega/cm^2$ (1200 Å) ITO glass substrate to form a hole injection layer having a thickness of 300 Å. Then, 10% P-DOPANT 25 constituting a hole transporting material is mixed with TPD and then the mixture is vacuum deposited on the hole injection layer to form a hole transport layer having a thickness of 300 Å.

ADN constituting a known blue fluorescent host and spiro-DPVBi constituting a known blue fluorescent dopant are simultaneously deposited in a weight ratio of 98:2 on the hole transport layer to form a light emitting layer having a thickness of 200 Å.

Then, 2-(4-(9,10-di(naphthalen-2-yl)anthracen-6-yl)phenyl)-1-phenyl-1H-benzo[d]imidazole and LiQ are mixed in a mixture ratio of 1:1 and then the mixture was deposited on the light emitting layer, thereby forming a mixed electron transport layer having a thickness of 300 Å. Then, Al is vacuum deposited to a thickness of 3,000 Å, thereby forming a LiF/Al electrode constituting an anode electrode, thereby completing the manufacture of a blue organic light emitting device.

The blue organic light emitting device had a driving voltage of 4.0 V at a current density of 11.5 $mA/cm^2$, a color coordinate of (0.142, 0.053), a current efficiency of 3.4 cd/A, and power efficiency of 2.7 lm/W.

In this case, the mixed electron transport layer had an energy gap of 2.8 eV between the HOMO and LUMO.

Example 2

A blue organic light emitting device is manufactured in the same manner as in Example 1, except that 10-(naphthalen-1-yl)-9(4-(naphthalen-2-yl)phenyl)anthracene is used instead of 2-(4-(9,10-di(naphthalen-2-yl)anthracen-6-yl)phenyl)-1-phenyl-1H-benzo[d]imidazole.

The blue organic light emitting device had a driving voltage of 4.8 V at a current density of 12.0 $mA/cm^2$, a color coordinate of (0.145, 0.048), a current efficiency of 3.1 cd/A, and power efficiency of 2.0 lm/W.

In this case, the mixed electron transport layer had an energy gap of 2.96 eV between the HOMO and LUMO.

Comparative Example

A blue organic light emitting device is manufactured in the same manner as in Example 1, except that the electron transport layer is formed of only $AlQ_3$ having an energy gap between the HOMO and LUMO lower than 2.8 eV, a value that is optimized for green light emission.

The blue organic light emitting device had a driving voltage of 4.4 V at a current density of 14.0 $mA/cm^2$, a color coordinate of (0.132, 0.077), a current efficiency of 4.4 cd/A, and power efficiency of 3.1 lm/W.

In this case, the electron transport layer had an energy gap of 2.64 eV between the HOMO and LUMO.

The current density, driving voltage, color coordinate (x, y), and power efficiency of the blue organic light emitting devices manufactured according to Examples 1 and 2 and the Comparative Example are shown in Table 1:

TABLE 1

|  | Driving voltage (V) | Current density (mA/cm$^2$) | Current efficiency (cd/A) | Power efficiency (lm/W) | x | y | (0.13, 0.075) Conversion efficiency |
|---|---|---|---|---|---|---|---|
| Example 1 | 4.0 | 11.5 | 3.4 | 2.7 | 0.142 | 0.053 | 4.8 |
| Example 2 | 4.8 | 12.0 | 3.1 | 2.0 | 0.145 | 0.048 | 4.8 |
| Comparative Example | 4.4 | 14.0 | 4.4 | 3.1 | 0.132 | 0.077 | 4.3 |

Referring to Table 1, it can be seen that the conversion efficiency of the electron transport layers of the blue organic light emitting devices manufactured according to Examples 1 and 2 is higher than that of the Comparative Example.

Table 2 shows the HOMO, LUMO and energy gap of the electron transport layer forming material used in Examples 1 and 2 and the Comparative Example. Referring to Table 2, the energy gaps of the electron transport layer forming material used in Examples 1 and 2 all are 2.8 eV or more, as opposed to that of the Comparative Example.

TABLE 2

|  | Comparative Example (AlQ$_3$) | Example 1 (L201) | Example 2 (TC1558) |
|---|---|---|---|
| LUMO | 3.14 | 2.8 | 2.93 |
| HOMO | 5.78 | 5.6 | 5.89 |
| Energy gap | 2.64 | 2.8 | 2.96 |

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A blue organic light emitting device comprising:
a substrate;
a first electrode disposed on the substrate;
a hole transport layer disposed on the first electrode;
a blue light emitting layer disposed on the hole transport layer;
an electron transport layer disposed on the blue light emitting layer;
a second electrode disposed on the electron transport layer, the electron transport layer comprising a material with an energy gap of 2.8 eV or more between the highest occupied molecular orbital (HOMO) and the lowest unoccupied molecular orbital (LUMO); and
a p-dopant material having a LUMO energy level lower than 5 eV and a HOMO energy level lower than 7 eV, wherein the p-dopant material is disposed between the first electrode and the blue light emitting layer.

2. The blue organic light emitting device of claim 1, wherein the material with an energy gap of 2.8 eV or more between the HOMO and LUMO is selected from the group consisting of anthracene, a compound containing an anthracene unit, naphthalene, a compound containing a naphthalene unit, styrene, a compound containing a styrene unit, a silicon-containing compound, triphenylene, a compound containing a triphenylene unit, pyrene, a compound containing a pyrene unit, and combinations thereof.

3. The blue organic light emitting device of claim 1, wherein the electron transport layer comprises an electron transporting material and an electron injection material.

4. The blue organic light emitting device of claim 3, wherein the electron injection material is selected from the group consisting of LiQ, LiF, NaCl, CsF, Li$_2$O, BaO, and combinations thereof.

5. The blue organic light emitting device of claim 1, further comprising an intermediate layer between the first electrode and the blue light emitting layer, wherein the intermediate layer comprises the p-dopant material having a LUMO energy level lower than 5 eV and a HOMO energy level lower than 7 eV.

6. The blue organic light emitting device of claim 5, wherein the intermediate layer comprises a hole transport layer.

* * * * *